(12) United States Patent
Lee

(10) Patent No.: US 6,503,835 B1
(45) Date of Patent: Jan. 7, 2003

(54) METHOD OF MAKING AN ORGANIC COPPER DIFFUSION BARRIER LAYER

(75) Inventor: Shyh-Dar Lee, Hsinchu (TW)

(73) Assignee: Silicon Integrated Systems, Corp., Taiwan (CN)

( * ) Notice: Subject to any disclaimer, the term of this patent is extended or adjusted under 35 U.S.C. 154(b) by 0 days.

(21) Appl. No.: 09/939,606

(22) Filed: Aug. 28, 2001

(51) Int. Cl.[7] ............................................... H01L 21/44
(52) U.S. Cl. ........................ 438/687; 438/624; 438/627; 438/637; 438/638
(58) Field of Search ............................... 438/687, 637, 438/638, 624, 627

(56) References Cited

U.S. PATENT DOCUMENTS

| | | | |
|---|---|---|---|
| 6,323,131 B1 * | 11/2001 | Obeng et al. | 438/687 |
| 6,326,301 B1 * | 12/2001 | Venkatesan et al. | 438/638 |
| 2001/0009803 A1 * | 7/2001 | Uglow et al. | 438/622 |
| 2001/0010970 A1 * | 8/2001 | Uglow et al. | 438/622 |
| 2001/0021581 A1 * | 9/2001 | Moon et al. | 438/687 |
| 2001/0046783 A1 * | 11/2001 | Furusawa et al. | 438/736 |

* cited by examiner

Primary Examiner—John F. Niebling
Assistant Examiner—Lynne A. Gurley

(57) ABSTRACT

An organic copper diffusion barrier layer having low dielectric constant is provided. The organic copper diffusion barrier layer can be applied to a dual damascene structure, which is formed between a copper wiring layer and an organic dielectric layer, to defend copper diffusion from the copper wiring layer into the organic dielectric layer. The organic copper diffusion barrier layer includes a benzocyclo polymer, which it has a benzene ring functional group that can catch copper and prevent copper diffusing into the organic dielectric layer. The problem of thermal diffusion and electro-migration can be avoided.

8 Claims, 3 Drawing Sheets

METHOD OF MAKING AN ORGANIC COPPER DIFFUSION BARRIER LAYER

FIELD OF THE INVENTION

The present invention relates to a semiconductor structure and process, and more particularly to an organic copper diffusion barrier layer used in a copper damascene structure, which it can defend copper diffusion.

BACKGROUND OF THE INVENTION

High-density integrated circuits, such as very large scale integration (VLSI) circuits, are typically formed with two or multiple metal interconnects served as three-dimensional wiring line structures to comply with a very high density of devices. A multilevel interconnect structure comprises a first metal wiring layer electrically connecting to a source/drain region in a substrate via a metal plug. The electrical connections between various devices are achieved by the formation of a second or other metal wiring layers. The isolations in one metal wiring layer are achieved by the formation of an inter-metal dielectric (IMD) layer, and the electrical connections between two adjacent wiring layers are achieved by forming a plurality of metal via plugs. Recently, a process of fabricating multilevel interconnect structure which can form the metal wiring layers and metal via plugs at the same time is developed, and named dual damascene process.

Aluminum (Al) is a popularly used conductive material for connecting various devices in conventional semiconductor process because of high conductivity and low cost, and facility of deposition and etching. As the integrated density increases, the capacitance effect between metal wires increases. Consequently, the resistance-capacitance time delay (RC delay time) increases, and cross talk between the metal wires become more frequent. The metal wires thus carries a current flow in a slower speed.

In the various factors, inherent resistivity of metal wires and parasitic capacitance between the metal wires become the crucial factors of determining the speed of current flow. The parasitic capacitance can be reduced by insulating metal wiring layers with low k (dielectric constant) materials which they are generally lower than 3.5. To achieve the reduction of the resistivity of metal wires, materials with low resistivity are selected for fabricating the metal wires. Copper (Cu) having relative high melting point, low resistance (about 1.7 $\mu\Omega$-cm) and high electro-migration gradually becomes a new material for replacing aluminum. However, copper has relative high diffusion coefficient. If the copper layers are contacted with dielectric layers, such as silicon dioxide or organic dielectric materials, copper will diffuse into dielectric layers to damage the characteristic of the dielectric layer, and thus forming a leakage.

Hence, in order to prevent the problem of thermal diffusion and electro-migration, a metal barrier layer is generally formed between the copper layer and dielectric layer in one metal wiring layer to defend copper diffusion. Moreover, a dielectric barrier layer is generally formed between upper and lower metal wiring layers to defend copper diffusion from the lower copper layer into upper dielectric layer. In conventional processes, silicon nitride is generally selected as the dielectric barrier layer, but the inherent properties of silicon nitride with very high dielectric constant of about 7 and low adhesion to copper layer results in poor improvement of RC time delay.

SUMMARY OF THE INVENTION

The present invention provides an organic copper diffusion barrier layer with low dielectric constant, which has good adhesion to copper layer and dielectric layer and can prevent thermal diffusion or electro-migration problems.

In one aspect, the present invention provides a copper damascene structure adapted for a semiconductor substrate. The copper damascene structure comprises a first dielectric layer having an opening on the semiconductor substrate. A first copper layer is located in the opening of the first dielectric layer. An organic copper diffusion barrier layer including a benzocyclo polymer is located on the first copper layer and the first dielectric layer. A second dielectric layer is located on the organic copper diffusion barrier layer. A second copper layer is located in the second copper layer, wherein a portion of the second copper layer is connected to the first copper layer through the organic copper diffusion barrier layer.

The second copper layer can be a dual damascene structure composed of a copper wiring layer and a copper via plug. The copper via plug passing through the organic copper diffusion barrier layer is connected to a portion of the first copper layer.

In another aspect, the present invention provides a method of forming a copper damascene structure. The method comprises the following steps. A semiconductor substrate is provided. A first dielectric layer having an opening is formed over the semiconductor substrate. A first copper layer is formed in the opening of the first dielectric layer. An organic copper diffusion barrier layer is formed over the first copper layer and the first dielectric layer. A second dielectric layer is formed over the organic copper diffusion barrier layer. A second copper layer is formed in the second dielectric layer, wherein a portion of the second copper layer is connected to the first copper layer through the organic copper diffusion barrier layer.

In another aspect, the present invention provides an organic copper diffusion barrier layer. The organic diffusion barrier layer is formed on a copper layer, and a dielectric layer is formed thereon. The organic diffusion barrier layer comprises a benzocyclo polymer of which having a benzene ring functional group that can defend copper diffusion from the copper layer to the dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention provides an organic copper diffusion barrier layer with low dielectric constant, which has good adhesion to copper layer and dielectric layer, and can prevent thermal diffusion or electro-migration problems.

Figure 1:
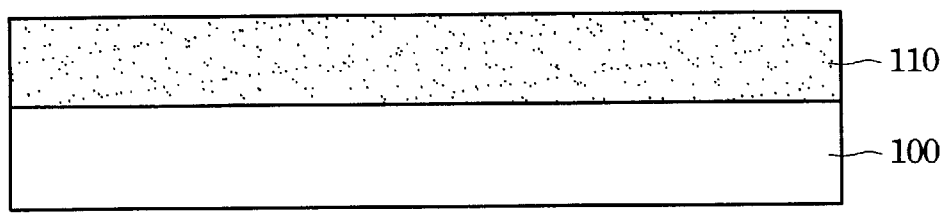
FIGS. 1A–1I are schematic cross-sectional views according to one preferred embodiment of the present invention.
Figure 1:
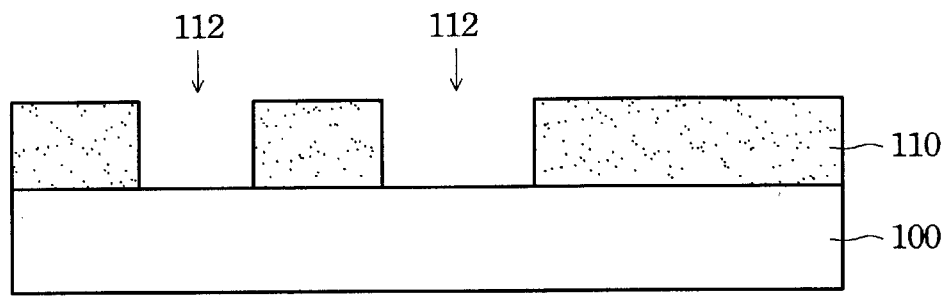
Figure 1:
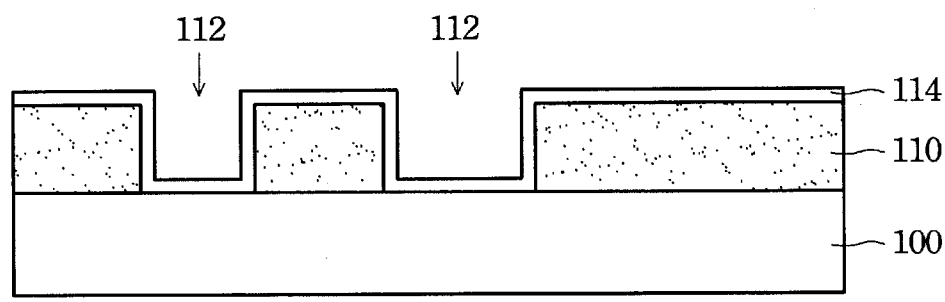
Figure 1:
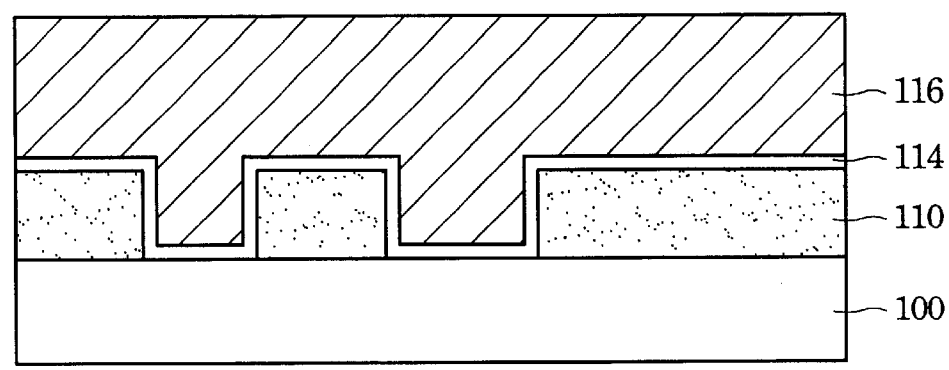

FIGS. 1A–1I are schematic cross-sectional views according to one preferred embodiment of the present invention. Referring to FIG. 1A, a semiconductor substrate 100, such as a p-type silicon wafer with <100> lattice structure, is provided. A plurality of fabricating procedures have been performed on the substrate 100, and a plurality of semiconductor devices, such as MOS transistor, etc., have been finished on the substrate 100. A first dielectric layer 110 is formed over the whole substrate 100. The first dielectric layer 110 is made of a low dielectric constant (low k) material, which it comprises spin-on polymer, such as FLARE, SiLk, PAE-II, Velox, etc, or spin-on glass (SOG). The first dielectric layer 110 can be formed by chemical vapor deposition (CVD), or spin-on coating technologies, etc. Typically, the dielectric constant of the first dielectric layer 110 is lower than 3.5, even lower than 3.0.

Referring to FIG. 1B, the first dielectric layer 110 is then patterned to form trench openings 112 in the first dielectric layer 110 to prepare for subsequently forming copper wiring layers. The trench openings 112 are generally fabricated by forming a photoresist layer (not shown) on the first dielectric layer, and then patterning the photoresist layer by conventional photolithography process to obtain desired trench pattern on the photoresist layer. The first dielectric layer 110 is then anisotropically etched by using the patterned photoresist layer as a mask until the underlying substrate 100 is exposed, to form desired trench openings 112 in the first dielectric layer 110. The patterned photoresist layer is finally removed.

Referring to FIG. 1C, a metal barrier layer 114 is conformally formed over the substrate 100. The metal barrier layer 114 is composed of a material having low resistivity selected from metal and metal containing compound, such as tantalum (Ta), tantalum nitride (TaN), titanium (Ti), titanium nitride (TiN), or tungsten (W), etc. The metal barrier layer 114 can be formed by physical vapor deposition (PVD) or chemical vapor deposition (CVD) processes, etc. The metal barrier layer 114 is a thin layer having a thickness of about 30–300 angstroms, and conformally inside the trench openings 112.

Referring to FIG. 1D, a first copper layer 116 is formed on the metal barrier layer 114, and fills up the trench openings 112. The first copper layer 116 can be formed by such as sputtering, chemical vapor deposition, or electro-chemical plating technologies, etc.

Figure 1E:
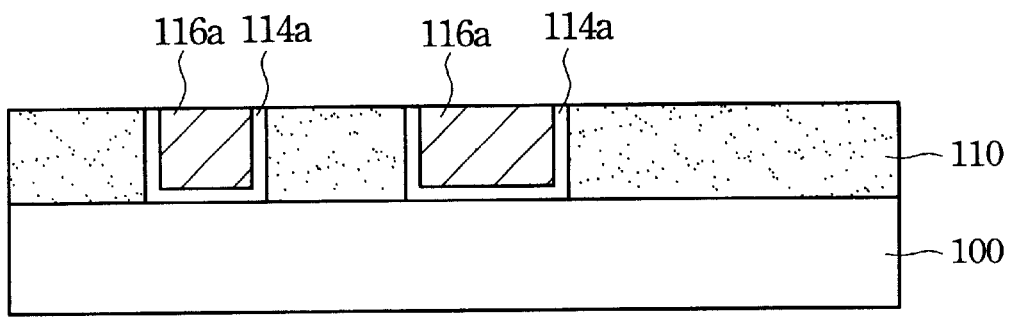

Referring to FIG. 1E, a planarizing process is following performed to remove undesired portion on the first dielectric layer 110. The first copper layer 116 can be planarized by, for example, chemical mechanical polishing (CMP) process to remove the undesired portion on the first dielectric layer 110 until the underlying metal barrier layer 114 is exposed. The exposed metal barrier layer 114 is continuously removed until the first dielectric layer 110 is exposed. The remaining portions in the trench openings 112 are first copper layers 116a and metal barrier layers 114a to serve as first metal wires. After the polishing step is finished, the exposed surface of the first copper layers 116a is oxidized to copper dioxide because of existing air. A reduction process is performed to reduce copper dioxide to become copper by injecting reduction gas, such as hydrogen gas, to prevent resistance increase of the first copper layer 116a.

Figure 1F:
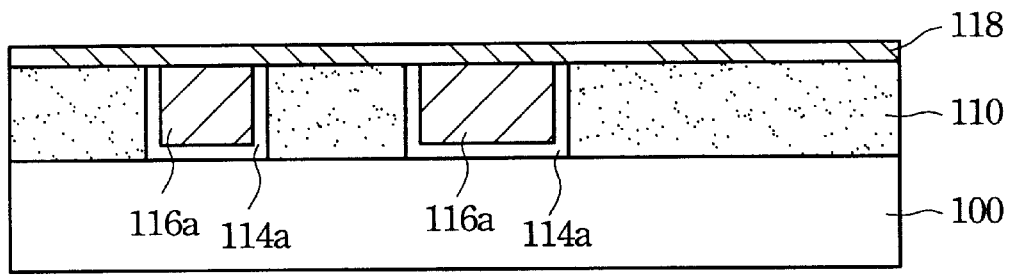

Referring to FIG. 1F, an organic copper diffusion barrier layer 118 is formed over the substrate 100 and covering the first copper layer 116a and the first dielectric layer 110. The organic copper diffusion barrier layer 118 at least comprises a benzocyclo polymer. The benzocyclo polymer includes a benzene ring functional group that can defend copper diffusion into subsequently formed dielectric layer thereon to prevent leakage problem. The benzocyclo polymer is an organic compound with low dielectric constant. The benzocyclo polymer, for example, can be a polymer of benzocyclobutene, which it has dielectric constant of about 2.7 lower than conventional dielectric barrier layer, such as silicon oxide, silicon nitride, and silicon carbide having dielectric constant of about 4–7. In addition, the organic copper diffusion barrier layer 118 has good adhesion to copper layer and organic dielectric layer, and thereby a crack issue can be avoided.

The organic copper diffusion barrier layer 118 is preferably formed by spin-on coating. The organic copper diffusion barrier layer 118 has a thickness substantially enough to defend copper diffusion. The organic copper diffusion barrier layer 118 has a thickness of about 100–1200 angstroms, and more preferably has a thickness of about 300–900 angstroms, and most preferably has a thickness of about 500 angstroms. In the process of forming the organic copper diffusion barrier layer 118, an organic solvent can be optionally added to control the viscosity during the spin-on coating process. In the subsequent baking process, a three-step baking process can be chosen, and the baking temperatures can be in the ranges of 90–120 degrees, 120–150 degrees, and 150–180 degrees. The baking time for each step can be about 30 seconds to 1–2 minutes. Nitrogen gas can be optionally induced in the baking process to improve baking result. Furthermore, the organic copper diffusion barrier layer 118 is preferably formed with a multi-layer structure, which it is stacked layer by layer to obtain better defend result.

Figure 1G:
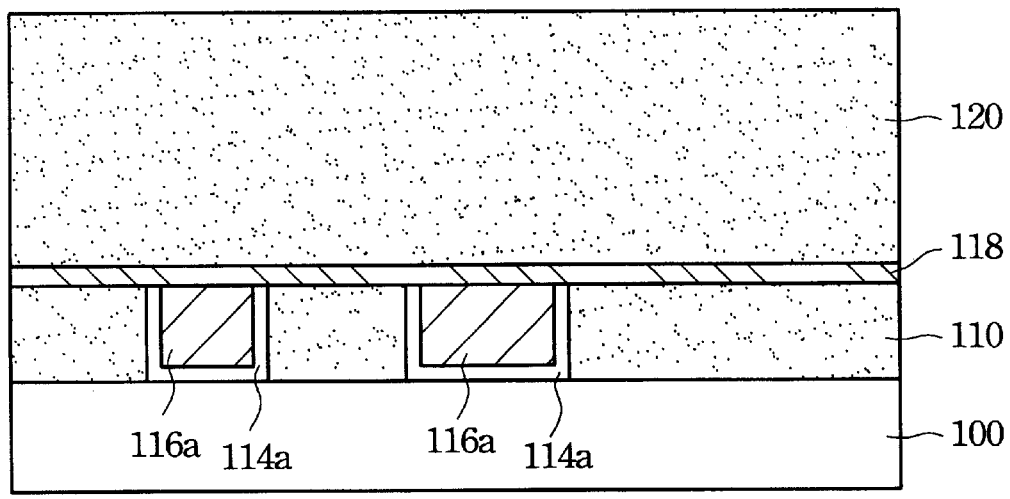

Referring to FIG. 1G, a second dielectric layer is formed on the organic copper diffusion barrier layer 118. The second dielectric layer 120 is made of a low dielectric constant (low k) material, which it comprises spin-on polymer, such as FLARE, SiLk, PAE-II, Velox, etc, or spin-on glass (SOG). The second dielectric layer 120 can be formed by chemical vapor deposition (CVD), or spin-on coating technologies, etc.

Figure 1H:
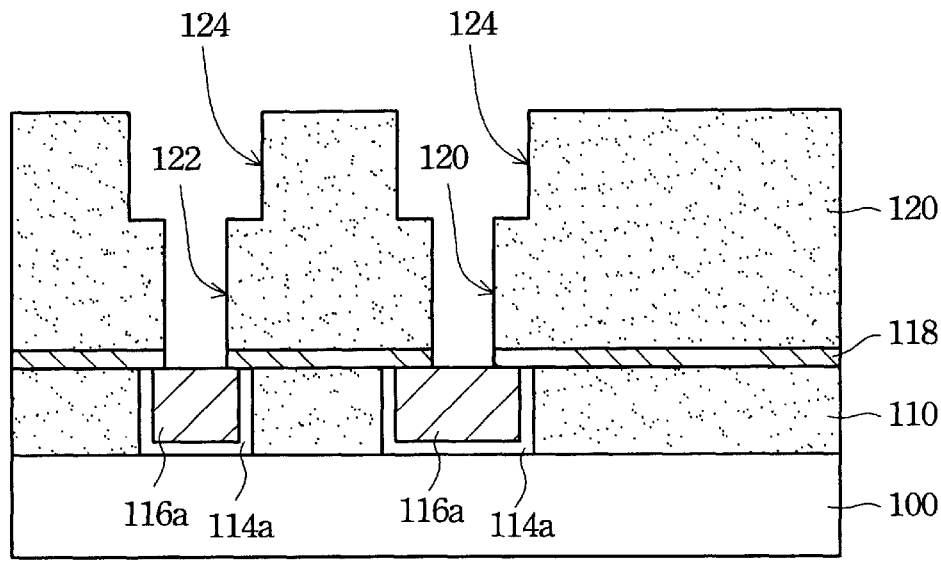

Referring to FIG. 1H, dual damascene openings including upper trench openings 124 and lower via openings 122 are formed in the second dielectric layer 120 and organic copper diffusion barrier layer 118. As well known to a person of ordinary skill in the art, each via opening 122 is located under the bottom of the trench opening 124, and the bottom of the via opening 122 exposes a portion of the first copper layer 116a. The method of fabricating the dual damascene structure is well known to a person of ordinary skill in the art. For example, the trench openings 124 can be formed earlier than the via openings 122, or be formed later than the via openings 122, and so that it is not further discussed in detail.

Figure 1I:
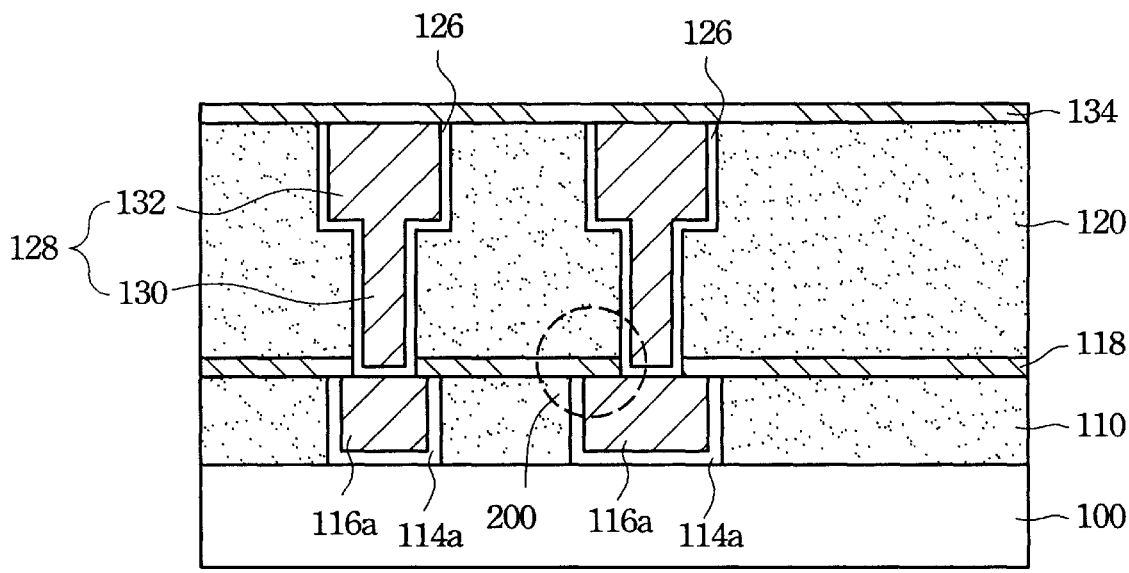

Referring to FIG. 1I, a thin metal barrier layer 126 can be conformally formed on the over the substrate 100 and inside the via openings 122 and the trench openings 124. The metal barrier layer 126 can use a material as foregoing description of the metal barrier layer 114. A second copper layer 128 is then filled into the via openings 122 and the trench openings 124 to form a dual damascene structure. The dual damascene structure can be formed by following steps. The second copper layer 128 is formed to fill the via openings 122 and trench openings 124, and then planarized by CMP to remove undesired portions. The remaining portions of the second copper layer 128 and the metal barrier layer 126 in the via openings 122 and trench openings 124 are via plugs 130 and copper wiring layers 132, respectively, and they constitute a dual damascene structure. Wherein, the copper wiring layers 132 are connected to the underlying first copper layers 116a through the via plugs 130.

Since the via plugs 130 are in a pillared form, only some portions of the first copper layers 116a are coupled to the via plugs 130. The uncoupled portions of the first copper layers 116a are isolated with the organic copper diffusion barrier layer 118 between the first copper layers 116a and the second dielectric layer 120, as indicated by the dash circle 200. Hence, the copper in the first copper layers 116a can not diffuse into the second dielectric layer 120, so that thermal diffusion and electro-migration problems will not be occurred. Another organic copper diffusion barrier layer 134 is formed on the second copper layer 128, and then other fabricating processes are continued.

According to above description, the present invention provides an organic copper diffusion barrier layer, which is a low k barrier layer. The organic copper diffusion barrier layer can provide good adhesion to metal layer and inter-metal dielectric layer, and can prevent thermal diffusion or electro-migration problems occurred.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a copper damascene structure, comprising the steps of:

providing a semiconductor substrate;

forming a first dielectric layer with an opening over the semiconductor substrate;

forming a first copper layer in the opening of the first dielectric layer;

forming an organic copper diffusion barrier layer having a benzocyclo polymer over the first copper layer and the first dielectric layer;

forming a second dielectric layer over the organic copper diffusion barrier layer; and forming a second copper layer in the second dielectric layer, wherein a portion of the second copper layer is connected to the first copper layer through the organic copper diffusion barrier layer.

2. The method according to claim 1, wherein forming the first copper layer in the first dielectric layer comprises the steps of:

forming a patterned photoresist layer on the first dielectric layer;

anisotropically etching the first dielectric layer to form a trench opening in the first dielectric layer by using the patterned photoresist layer as a mask;

removing the patterned photoresist layer; and filling the trench opening with copper to form the first copper layer.

3. The method according to claim 1, wherein the thickness of the organic copper diffusion barrier layer is about 300–900 angstroms.

4. The method according to claim 1, wherein a method of forming the organic copper diffusion barrier layer comprises spin-on coating.

5. The method according to claim 1, wherein the benzocyclo polymer comprising a polymer of benzocyclobutene.

6. The method according to claim 1, wherein the benzocyclo polymer has a benzene ring functional group that can defend the copper diffusion from the first copper layer to the second dielectric layer.

7. The method according to claim 1, wherein the second copper layer is composed of a copper wiring layer and a copper via plug, and the copper wiring layer is connected to the first copper layer through the copper via plug.

8. The method according to claim 7, wherein forming the second copper layer comprises the steps of:

forming a trench opening and a via opening in the second dielectric layer, wherein the via opening is under the bottom of the trench opening and the via opening exposes the first copper layer in the bottom; and filling the via opening and the trench opening with copper to form the copper via plug and the copper wiring layer, respectively.

\* \* \* \* \*